(12) United States Patent
Lam

(10) Patent No.: US 8,807,903 B2
(45) Date of Patent: Aug. 19, 2014

(54) COTTER SPRING PIN

(75) Inventor: Chien A. Lam, San Mateo, CA (US)

(73) Assignee: Echelon Corporation, San Jose, CA (US)

( * ) Notice: Subject to any disclaimer, the term of this patent is extended or adjusted under 35 U.S.C. 154(b) by 508 days.

(21) Appl. No.: 12/661,346

(22) Filed: Mar. 15, 2010

(65) Prior Publication Data

US 2011/0222989 A1   Sep. 15, 2011

(51) Int. Cl.
 *F16B 2/24*   (2006.01)
(52) U.S. Cl.
 CPC ..................... *F16B 2/248* (2013.01)
 USPC ............... 411/530; 24/546; D8/370
(58) Field of Classification Search
 CPC ....................................... F16B 2/248
 USPC ............ 411/516, 530, 513, 316; 403/379.6; 24/458, 546, 566; D8/370, 394
 See application file for complete search history.

(56) References Cited

U.S. PATENT DOCUMENTS

| | | | | | |
|---|---|---|---|---|---|
| 1,196,087 | A | * | 8/1916 | Crume | 24/458 |
| 1,893,537 | A | * | 1/1933 | Cruze | 403/408.1 |
| 2,074,475 | A | * | 3/1937 | Jesser | 292/258 |
| 2,406,665 | A | * | 8/1946 | Churchill | 24/458 |
| 2,638,790 | A | * | 5/1953 | Perron | 474/221 |
| 2,657,443 | A | * | 11/1953 | Hartman | 248/56 |
| 2,668,342 | A | * | 2/1954 | Nelsson | 24/561 |
| 3,350,855 | A | * | 11/1967 | Revell | 55/354 |
| 3,561,799 | A | * | 2/1971 | Hutchinson | 403/356 |
| 3,599,527 | A | * | 8/1971 | Howells | 411/530 |
| D252,256 | S | * | 7/1979 | Kline | D8/395 |
| 4,197,906 | A | * | 4/1980 | Leech et al. | 165/76 |
| 4,507,831 | A | * | 4/1985 | McClure | 24/593.1 |
| 5,038,843 | A | * | 8/1991 | Sommerfeld | 160/176.1 R |
| 6,135,692 | A | * | 10/2000 | Lary | 411/530 |
| 7,047,603 | B2 | * | 5/2006 | Holliday et al. | 24/546 |

* cited by examiner

*Primary Examiner* — Flemming Saether
(74) *Attorney, Agent, or Firm* — Blakely Sokoloff Taylor & Zafman LLP

(57) ABSTRACT

A retainer pin is described for retaining, in one embodiment, a relatively thin blade against a transverse surface. The pin has a transition section which extends through an opening in the blade, a keeper section extending along one side of the blade, and a snap arm and snap end extending along an opposite side of the blade with a snap snapping over the edge of the blade.

10 Claims, 4 Drawing Sheets

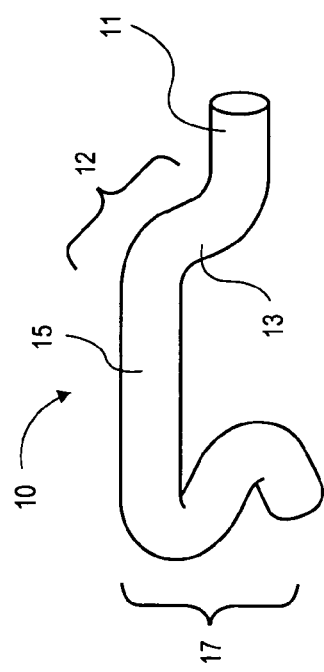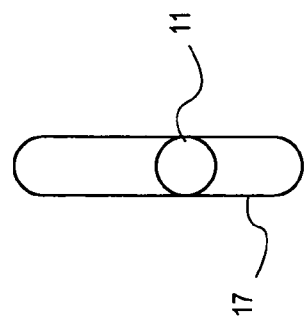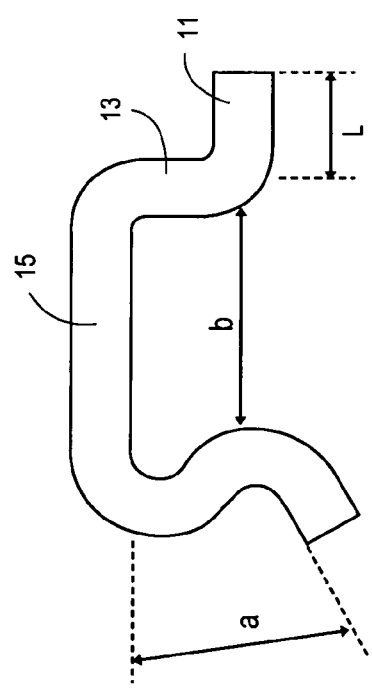

COTTER SPRING PIN

FIELD OF THE INVENTION

The invention relates to retainer pins such as a cotter pin.

PRIOR ART AND RELATED ART

Retainer pins such as cotter pins are well known in the art. The present invention is an easier to install alternative to such pins suitable for certain applications.

SUMMARY OF THE INVENTION

A retainer pin which may be used as a replacement for a cotter pin in some applications is disclosed. The retainer pin is particularly useful when used with a blade-like structure having an edge for receiving the snap end of the retainer pin. The pin has a linear retainer portion forming a transition between a snap arm and a keeper and when installed, the linear portion fits within, for instance, an aperture in a blade. The snap arm and keeper are generally parallel and extend in opposite directions from the retainer portion. The distal end of the snap arm defines an s-shaped snap generally parallel to the linear retainer portion, which snaps over the edge of the blade to keep the pin from moving in one direction as the pin contacts a surface.

BRIEF DESCRIPTION OF THE DRAWINGS

FIG. 1 is a perspective view of the invented pin.
FIG. 2 is an elevation view of the pin of FIG. 1.
FIG. 3 is a side view of the pin of FIGS. 1 and 2.

DETAILED DESCRIPTION

A retainer pin which may be used as a substitute for a cotter pin in some applications is disclosed. The retainer pin of the present invention is particularly useful where a relatively thin member such as a blade-like structure requires retention against a surface through which the member has been inserted. Specific details are set forth below such as specific dimensions to provide a thorough understanding of the present invention. It will be obvious to one skilled in the art that the present invention may be practiced without these specific details.

Figure 7:
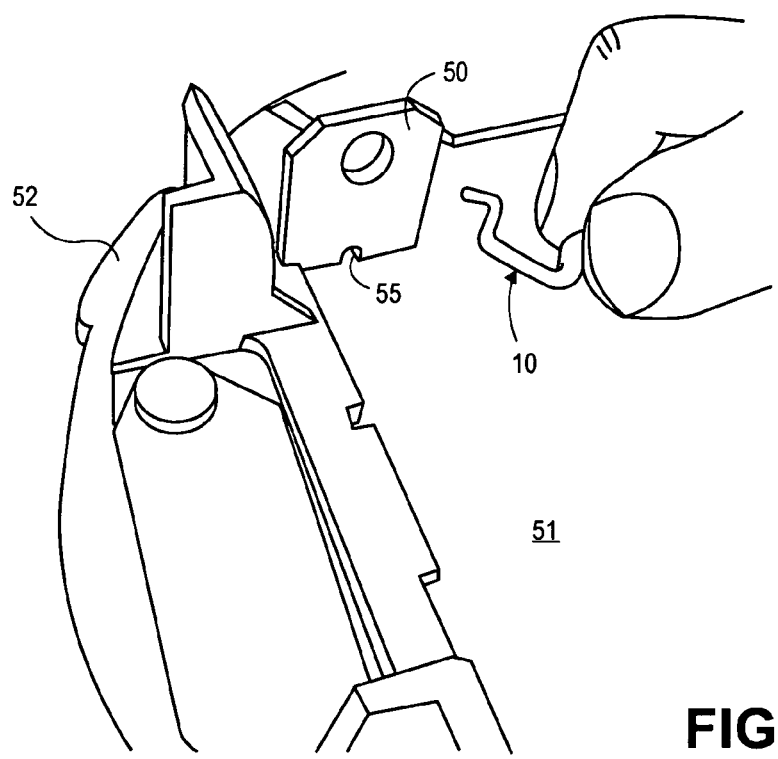
FIG. 7 is a perspective view showing the pin about to be installed in the blade inserted into the base of an electrical power meter.
Figure 8:
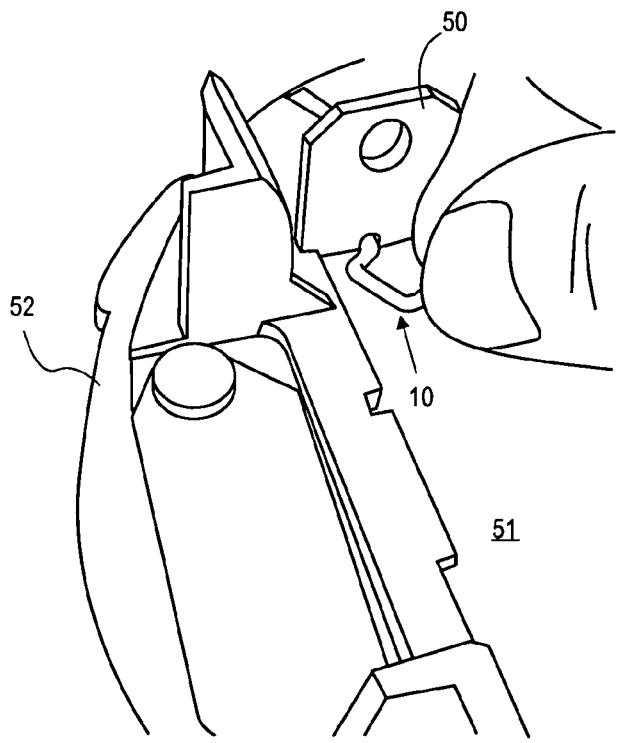
FIG. 8 shows the arrangement of FIG. 7 with the keeper section of the retainer pin installed within the blade.
Figure 9:
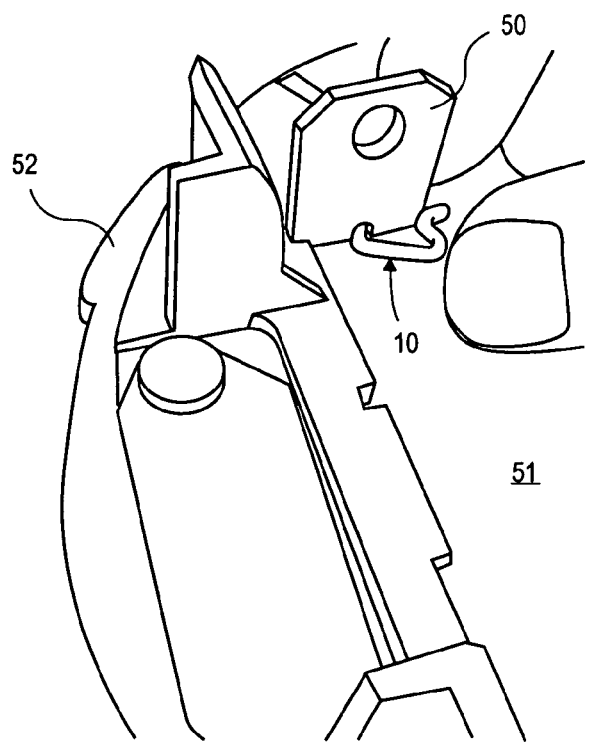
FIG. 9 shows the arrangement of FIG. 8 where the retainer pin is about to be snapped onto the blade.
Figure 10:
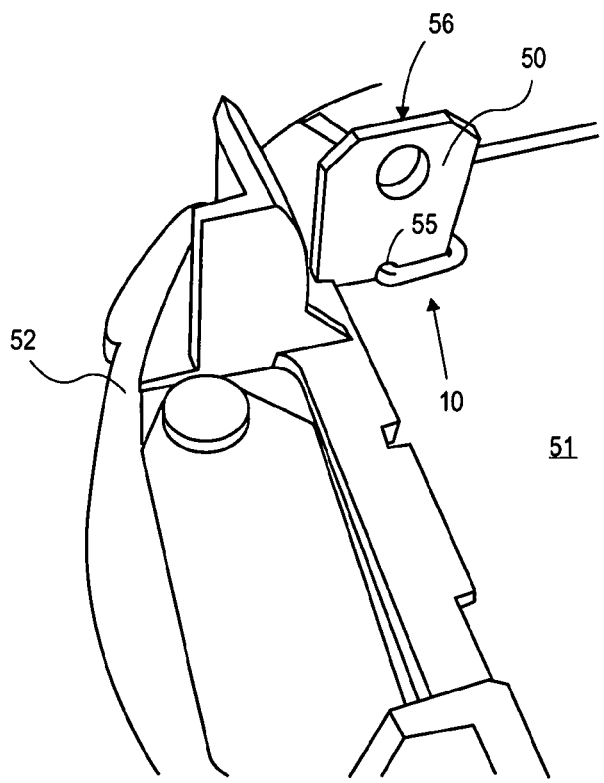
FIG. 10 shows the arrangement of FIG. 9 with the retainer pin installed on the blade.

An understanding of the retention pin described in this application is perhaps best understood from FIGS. 7-10. Referring then to FIG. 7, an electrical meter base 52 is shown having a surface 51. The surface 51 has slots for receiving a plurality of blades 50 (typically four, only one of which is shown). The blades are part of an underlying assembly, which is hidden by surface 51 and which needs to be secured to the base 52. The blades are bus bars, and after their installation into the base 52 a meter is secured onto the base 52, making electrical contact with the blades. As shown in FIG. 7, the pin 10 is about to be installed within the aperture 55 of the blade 50. FIG. 8 shows the keeper end of the pin inserted into the aperture 55 and the transition section of the pin about to be installed into the aperture 55 as the pin is rotated. In FIG. 9 the snap end is ready to be snapped onto the edge of the blade 50. Finally, as shown in FIG. 10 the snap end is engaging the blade 50.

The pin 10 now prevents the blade 50 from moving in the direction indicated by the arrow 56 because the pin is wedged against the surface 51 and extends through the aperture 55 of the blade 50. In the prior art, the blade 50 and like blades is secured against the base 51 by placing a cotter pin through the aperture 55. As will be appreciated the pin 10 of the present invention provides a much quicker installation.

Referring now to FIGS. 1, 2 and 3, the substantially coplanar pin has a keeper section 11, transitional section 12 with a linear portion 13, a snap arm 15 and a snap end 17. The keeper section 11, as will be described, has a length L which keeps the snap end in place, particularly in the presence of vibration or other movement. The transition section 12, which is perpendicular to the keeper 11, includes a linear portion 13 having a length approximately equal to the width of the blade, or the like structure. The snap arm 15 is generally perpendicular to the transition section 12 and extends in a direction generally opposite to, and parallel to, the keeper section 11. The s-shaped snap end 17 is generally parallel to the transition section 12.

In the preferred embodiment, the retainer pin is a continuous member fabricated from either steel or an injection molded high-temperature plastic where high temperatures are to be encountered. As an example, a type 304 stainless steel or spring steel may be used. In an embodiment where the center of the aperture 55 of FIG. 9 is approximately 10 mm from the edge of the blade 50 and the radius (r) of the retainer pin is approximately 0.8 mm, the diameter of the aperture 55 is slightly larger than 1.6 mm to allow the pin to pass through and be rotated into position. For this particular application, where the blade has a thickness of approximately 2.5 mm, the overall length of the pin measured from the end of the keeper section to the furthest extent of the snap end is 16.1 mm. The snap end measured from the top of the snap arm (as viewed in FIG. 2) to the lowest point of the snap arm is 9.7 mm; the angle "a" of FIG. 2 is 30°. The inside width of the pin (dimension "b" in FIG. 2) is 7.32 mm. L, the length of the keeper, is approximately 4.2 mm long.

Figure 4:
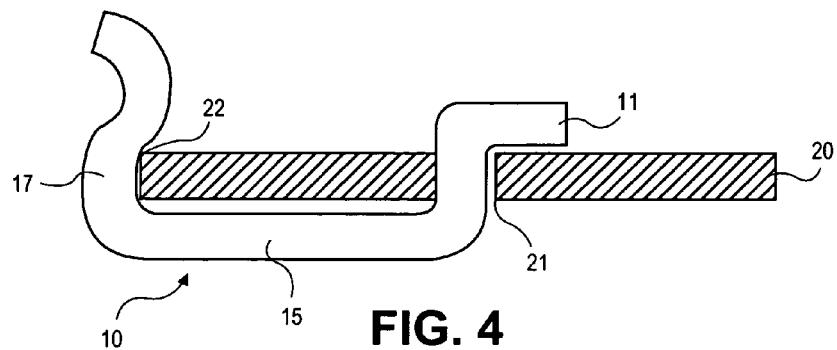
FIG. 4 is a cross-sectional view showing the pin of FIG. 1 installed.

The pin 10 is installed within an aperture 21 of a member 20 in FIG. 4. Note the width of member 20 is approximately equal to the length of the linear section of the pin. As can be seen in FIG. 4, retention of the snap end occurs at point 22 after the snapping action overcomes the corner of the member 20 at 22. The aggressiveness of this snapping action is controlled particularly by the snapping arm's length and the tolerances used in manufacturing. It is necessary for the pin to be flexible enough to overcome the fulcrum at 22 and then spring back into its original shape.

Figure 5:
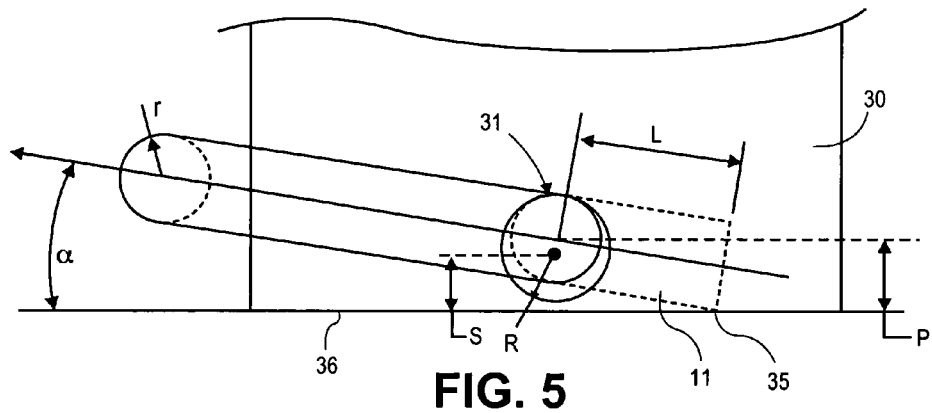
FIG. 5 is cross-sectional elevation view of an installed pin used to describe the importance of the length L of the keeper section of the pin.

The length L of the keeper section is important, as demonstrated in FIG. 5, in preventing the angle $\alpha$ from exceeding more than a few degrees since otherwise the pin 10 may snap off its engaged position. In FIG. 5 a blade 30 is shown having an aperture 31 with a radius R. The center of this aperture is a distance S from the surface 36, which the member 30 is retained against and P is the distance from surface 36 to the center of the pin 11; the pin has a radius r. Note there is some distance, albeit small, between the bottom of the aperture 31 and the surface 36. Assume:

$$Q = P - r = S + R - 2r$$

α then is approximately equal to:

$$\alpha = \arcsin(Q/L) = \arcsin\left(\frac{S + R - 2r}{L}\right)$$

L should be long enough to prevent a from becoming more than a few degrees before the keeper section's end contacts the surface 36 as shown at point 35. This contact prevents a from becoming larger, and the pin dislodging.

Figure 6:
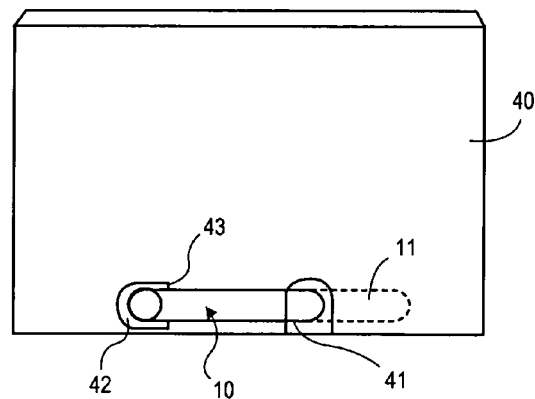
FIG. 6 is an elevation view showing the pin installed in a blade where an edge is formed by a slot in the blade which slot receives the snap end of the retainer pin.

FIG. 6 shows another installation where the pin 10 has a linear portion engaging the slot 41 of the blade 40. The keeper section 11 is also shown. A slot 42 is formed in the blade 40 to allow the snap end to engage the slot edge 43. This allows the pin to be used with a wider blade without the pin having to extend to the edge of the blade.

Thus, a retainer pin has been disclosed which may substitute for a cotter pin in some applications and which is much easier to install.

What is claimed is:

1. A retainer pin consisting of:
    a linear retainer portion forming a transition between a snap arm and a keeper, the snap arm and the keeper being generally parallel and extending in opposite directions from the linear retainer portion; and
    the distal end of the snap arm having an s-shaped snap extending in a direction generally parallel to the linear retainer portion and wherein a portion of the s-shaped snap extends toward the keeper to snap over an edge of a member retained by the retainer pin.

2. The retainer pin of claim 1, wherein the linear retainer portion, snap arm, keeper and s-shaped snap are coplanar.

3. The retainer pin of claim 2, wherein the retainer pin is a continuous member.

4. The retainer pin of claim 3, wherein the pin is fabricated from steel.

5. The retainer pin of claim 3, wherein the pin is fabricated from plastic.

6. The retainer pin of claim 1, wherein the keeper section has a length long enough to prevent an angle from becoming more than a few degrees before the keeper's end contacts a surface of the member.

7. A retainer pin having a uniform cross-sectional radius r, for insertion into a member with a width W and an aperture defined by the member having a radius larger than r, comprising:
    a keeper section of length L;
    a transition section extending perpendicular to one end of the keeper section having a linear portion approximately equal to W;
    a snap arm extending from the end of the transition section opposite the keeper section in a direction opposite to, and parallel to, the keeper section;
    a curved snap arm end extending from an end of the snap arm opposite the transition section and extending in a direction generally parallel to the transition section, wherein the curved snap arm end is an s-shaped end;
    wherein the keeper section, transition section, snap arm, and snap are coplanar; and
    wherein a portion of the curved snap arm extends toward the keeper to snap over an edge of the member when installed along a plane parallel to a longitudinal axis of the aperture.

8. The retainer pin of claim 7, wherein the retainer pin is a continuous member.

9. The retainer pin of claim 7, or 8, wherein the pin is fabricated from steel.

10. The retainer pin of claim 7, or 8 wherein the pin is fabricated from plastic.

* * * * *